United States Patent
Sato et al.

(10) Patent No.: US 10,490,684 B2
(45) Date of Patent: Nov. 26, 2019

(54) METHOD FOR PRODUCING A COMPOUND PHOTOVOLTAIC CELL

(71) Applicant: RICOH COMPANY, LTD., Tokyo (JP)

(72) Inventors: Shunichi Sato, Miyagi (JP); Nobuhiko Nishiyama, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 228 days.

(21) Appl. No.: 15/483,633

(22) Filed: Apr. 10, 2017

(65) Prior Publication Data

US 2017/0213932 A1    Jul. 27, 2017

Related U.S. Application Data

(63) Continuation of application No. 14/445,249, filed on Jul. 29, 2014, now abandoned.

(30) Foreign Application Priority Data

Jul. 30, 2013  (JP) .................................. 2013-157477
Jun. 9, 2014   (JP) .................................. 2014-118296

(51) Int. Cl.
    *H01L 31/0725*    (2012.01)
    *H01L 31/0735*    (2012.01)
    (Continued)

(52) U.S. Cl.
    CPC .... *H01L 31/0725* (2013.01); *H01L 31/02966* (2013.01); *H01L 31/03046* (2013.01);
    (Continued)

(58) Field of Classification Search
    CPC ......... H01L 31/02966; H01L 31/03046; H01L 31/0512; H01L 31/0687; H01L 31/0693;
    (Continued)

(56) References Cited

U.S. PATENT DOCUMENTS 5,183,779 A    2/1993  Tadayon et al.
5,679,963 A    10/1997 Klem et al.
(Continued)

FOREIGN PATENT DOCUMENTS

CN    101950774 A    1/2011
CN    103219414      7/2013
(Continued)

OTHER PUBLICATIONS

Japanese search report (and machine translation thereof obtained from Global Dossier) dated Feb. 22, 2018 in connection with corresponding Japanese patent application No. 2014-118296.
(Continued)

*Primary Examiner* — Duy T Nguyen
(74) *Attorney, Agent, or Firm* — Oblon, McClelland, Maier & Neustadt, L.L.P.

(57) ABSTRACT

A compound photovoltaic cell includes a substrate, a first cell made of a first semiconductor material and formed on the substrate, a tunnel layer, and a second cell made of a second semiconductor material lattice mismatched with a material of the substrate, connected to the first cell via the tunnel layer, and disposed on an incident side with respect to the first cell, wherein band gaps of the first and the second cells become smaller from an incident side to a back side, and wherein the tunnel layer includes a p-type layer disposed on the incident side and a n-type layer disposed on the back side, the p-type layer being a $p^+$-type (Al)GaInAs layer, the n-type layer being an $n^+$-type InP layer, an $n^+$-type GaInP layer having a tensile strain with respect to InP or $n^+$-type Ga(In)PSb layer having a tensile strain with respect to InP.

10 Claims, 13 Drawing Sheets

(51) Int. Cl.
  *H01L 31/0687* (2012.01)
  *H01L 31/05* (2014.01)
  *H01L 31/0304* (2006.01)
  *H01L 31/18* (2006.01)
  *H01L 31/0296* (2006.01)
  *H01L 31/0693* (2012.01)

(52) U.S. Cl.
  CPC ...... *H01L 31/0512* (2013.01); *H01L 31/0687* (2013.01); *H01L 31/0693* (2013.01); *H01L 31/0735* (2013.01); *H01L 31/1844* (2013.01); *Y02E 10/544* (2013.01)

(58) Field of Classification Search
  CPC ............. H01L 31/0725; H01L 31/0735; H01L 31/1844; Y02E 10/544
  See application file for complete search history.

(56) References Cited

U.S. PATENT DOCUMENTS

| | | | |
|---|---|---|---|
| 5,769,964 | A | 6/1998 | Charache et al. |
| 7,071,407 | B2 * | 7/2006 | Faterni ............... H01L 31/03046 136/255 |
| 2006/0011938 | A1 | 1/2006 | Debray et al. |
| 2007/0131275 | A1 * | 6/2007 | Kinsey ............... H01L 31/02246 136/255 |
| 2009/0229659 | A1 | 9/2009 | Wanlass et al. |
| 2010/0212729 | A1 | 8/2010 | Hsu |
| 2012/0125392 | A1 | 5/2012 | Woo et al. |
| 2012/0138116 | A1 | 6/2012 | Bhusari et al. |
| 2013/0048063 | A1 | 2/2013 | Walters et al. |
| 2013/0139877 | A1 | 6/2013 | Cornfeld |
| 2013/0298972 | A1 | 11/2013 | Lin et al. |
| 2014/0001509 | A1 | 1/2014 | Lin et al. |
| 2014/0076386 | A1 | 3/2014 | King et al. |
| 2014/0150858 | A1 | 6/2014 | Lin et al. |

FOREIGN PATENT DOCUMENTS

| | | |
|---|---|---|
| JP | 2010-171374 | 8/2010 |
| JP | 2013-543278 | 11/2013 |
| JP | 2014-123712 | 7/2014 |
| WO | 2012/067715 A2 | 5/2012 |
| WO | 2012/074596 | 6/2012 |
| WO | WO2014/081048 A1 | 5/2014 |
| WO | 2014/142340 A1 | 9/2014 |

OTHER PUBLICATIONS

Japanese official action dated Mar. 13, 2018 in connection with corresponding Japanese patent application No. 2014-118296.

European official action dated May 29, 2017 in connection with corresponding European patent application No. 14178623.6.

Zolper et al. "GaAsSb-Based Heterojunction Tunnel Diodes for Tandem Solar Cell Interconnects", Proc. of the World Conference on Photovoltaic Energy, Dec. 5-9, 1994, pp. 1843-1846.

Takamoto et al. "World's Highest Efficiency Triple-Junction Solar Cells Fabricated by Inverted Layers Transfer Process", 29th IEEE Photovoltaic Specialists Conference (2010), pp. 412-417.

Nakayama, et al. "Improved electrical properties of water-bonded p-GaAs/n-InP interferences with sulfide passivation" J. Appl. Phys. 103, 094503 (2008).

Sugiyama et al. "High-efficiency Quantum Structure Tandem Solar Cells" Journal of Applied Physics, vol. 79, No. 5 (2010) (with partial translation).

B.E. Sagol, et al. "Lifetime and Performance of InGaAsP and InGaAs Absorbers for Low Bandgap Tandem Solar Cells" 2009 IEEE.

European search report dated Jan. 28, 2015 in corresponding European Patent Application No. 14178623.6.

Guter W et al., "Current-matched triple-junction solar cell reaching 41.1% conversion efficiency under concentrated sunlight", Applied Physics Letters, American Institute of Pysics, Jun. 2009 vol. 94, No. 22, US.

Okuno Y. L. et al., "An InP/InGaAs tunnel junction fabricated on (311)B InP substrate by MOCVD", 2004 International Conference on Indium Phophide and Related Materials, Japan; May 2014, pp. 114-117, IEEE Operations Center, Piscataway, NJ.

Kohler F. et al., "Band gap and band offset of (GaIn) (PSb) lattice matched to InP", Applied Physics Letters, Jul. 2005, vol. 87, No. 3, American Institute of Physics, US.

Jou M. J. et al., "Organometallic vapor phase epitaxial growth studies of GaP 1-xSbx and InP 1-xSbx", Journal of Crystal Growth, Dec. 1989, vol. 98, No. 4, Elsevier, Amsterdam, NL.

Mar. 3, 2016 Chinese official action in connection with Chinese patent application No. 2014105413852.

King et al, "Metamorphic III-V materials, sublattice disorder, and multijunction solar cell approaches with over 37% efficiency", 2004.

Wanlass et al., "GaInP—GaAs—GaInAs monolithic tandem cells for high performance solar concentrator", 2005.

* cited by examiner p+GaAs/n+InP TUNNEL JUNCTION LAYER p+GaAs/p+GaInAs/n+InP TUNNEL JUNCTION LAYER

METHOD FOR PRODUCING A COMPOUND PHOTOVOLTAIC CELL

CROSS-REFERENCE TO RELATED APPLICATION APPLICATIONS

This application is a Rule 1.53(b) continuation of application Ser. No. 14/445,249 filed on Jul. 29, 2014, claiming priority of Japanese Applications Nos. 2013-157477 and 2014-118296 filed with the Japanese Patent office on Jul. 30, 2013 and Jun. 9, 2014, respectively.

TECHNICAL FIELD

The present invention relates to a compound photovoltaic cell.

BACKGROUND ART

A concentrated photovoltaic cell which utilizes an inexpensive condensing lens or mirrors in order to condense the sunlight and converts the condensed sunlight into electric energy has been known. A band gap of a compound photovoltaic cell can be varied by controlling a composition ratio of compound semiconductor materials with relative ease. Therefore, studies are being conducted to improve energy conversion efficiency of the compound photovoltaic cell by absorbing the sunlight in a broader wavelength range.

Further, there is a photovoltaic cell formed by depositing a GaInP cell and a GaAs cell that are lattice-matched with GaAs onto a GaAs substrate and by depositing a GaInAs cell which has about 2% lattice mismatch with GaAs onto the GaInP cell and the GaAs cell via a lattice relaxation buffer layer, for the sake of improving the conversion efficiency (see, for example, Non-Patent Document 1).

Further, there is a photovoltaic cell formed by forming a GaInP top cell and a highly-doped $p^+$-type layer onto a GaAs substrate, by forming a GaInAs bottom cell and a highly-doped $n^+$-type layer onto an InP substrate, and by joining (bonding) the $p^+$-type layer and the $n^+$-type layer in order to form a tunnel junction layer. The GaInP top cell and the GaInAs bottom cell are bonded in series with each other via the tunnel junction layer (see, for example, Patent Document 1).

If resistance of a joint interface of the tunnel junction layer is high, it becomes harder for a tunnel current to flow through the tunnel junction layer. As a result, the conversion efficiency is decreased.

Since the resistance of the joint interface of the tunnel junction layer is not fully reduced, the photovoltaic cell disclosed in patent document 1 cannot achieve an adequate conversion efficiency.
Patent Document 1: US 2012/0138116
Non-patent Document 1: Proceedings of the 29th IEEE Photovoltaic Specialists Conference (2010) pp. 412-417.

DISCLOSURE OF INVENTION

The present invention has been made in view of the above-described problems, and it is an object of at least one embodiment of the present invention to provide a compound photovoltaic cell with an improved conversion efficiency.

An aspect of the present invention provides a compound photovoltaic cell which includes a first substrate, one or more first photoelectric conversion cells configured to be made of a first compound semiconductor material and to be formed on the first substrate, a tunnel junction layer formed on the one or more first photoelectric conversion cells, and one or more second photoelectric conversion cells configured to be made of a second compound semiconductor material which is lattice mismatched with a material of the first substrate, to be connected to the one or more first photoelectric conversion cells via the tunnel junction layer, and to be disposed on an incident side in a light incident direction with respect to the one or more first photoelectric conversion cells, wherein band gaps of the one or more first photoelectric conversion cells and the one or more second photoelectric conversion cells become smaller from an incident side to a back side in a light incident direction, and wherein the tunnel junction layer includes a p-type layer disposed on the incident side and a n-type layer disposed on the back side, the p-type layer being a $p^+$-type (Al)GaInAs layer, the n-type layer being an $n^+$-type InP layer, an $n^+$-type GaInP layer having a tensile strain with respect to InP, or an $n^+$-type Ga(In)PSb layer having a tensile strain with respect to InP.

BEST MODE FOR CARRYING OUT THE INVENTION

Embodiments of the present invention are described below with reference to the accompanying drawings.

First Embodiment

Figure 1B:
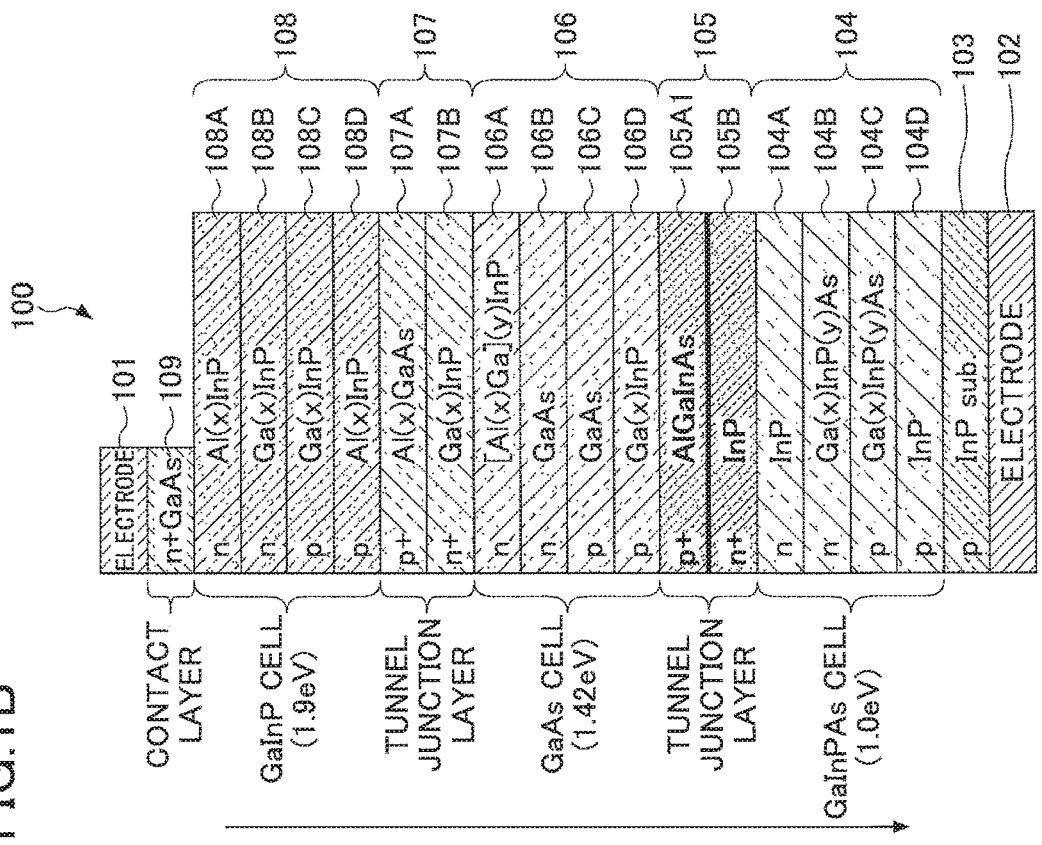
FIGS. 1A and 1B illustrate compound photovoltaic cells according to a first embodiment.
Figure 1A:
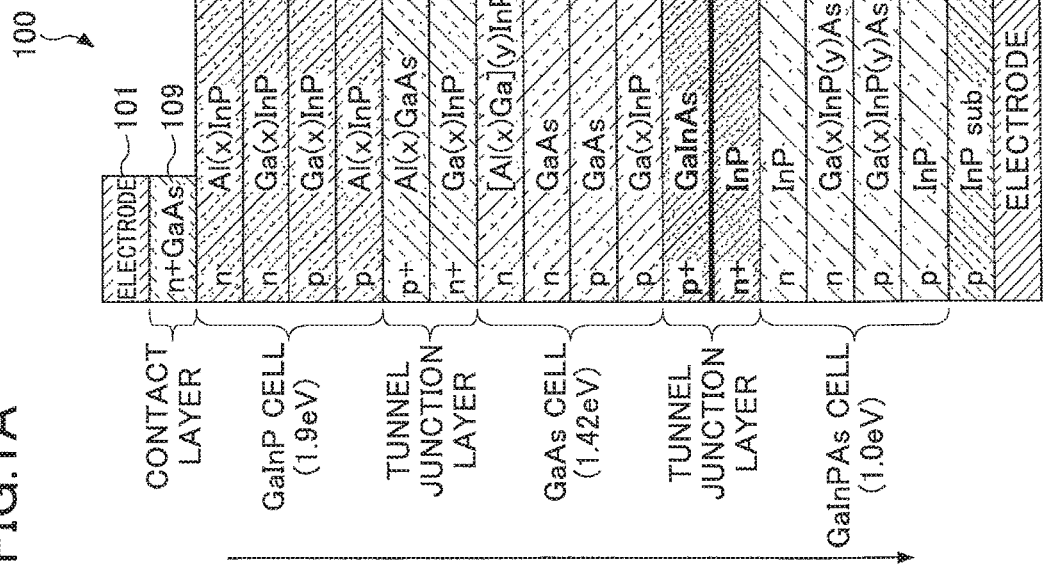
Figure 2:
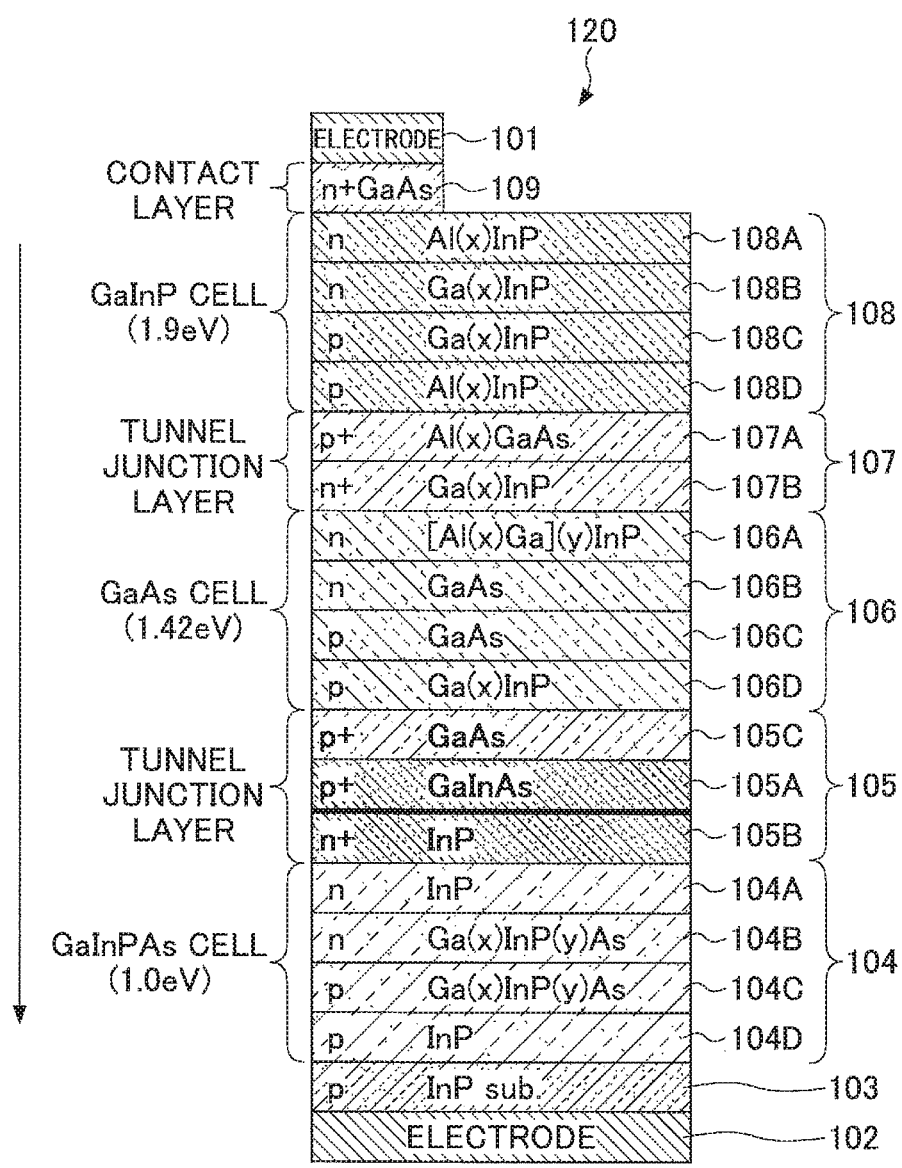
FIG. 2 illustrates a compound photovoltaic cell according to the first embodiment.

FIGS. 1A, 1B and 2 are diagrams illustrating cross sections of a compound photovoltaic cell 100 according to the first embodiment.

The compound photovoltaic cell 100 includes an electrode 101, an electrode 102, an InP substrate 103, a GaInPAs cell 104, a tunnel junction layer 105, a GaAs cell 106, a tunnel junction layer 107, a GaInP cell 108 and a contact layer 109.

The tunnel junction layer 105 is formed between the GaInPAs cell 104 and the GaAs cell 106. The tunnel junction layer 107 is formed between the GaAs cell 106 and the GaInP cell 108. The GaInPAs cell 104, the GaAs cell 106 and the GaInP cell 108 are electrically and optically connected in series with each other by being bonded by the tunnel junction layers 105 and 107. Herein, each of the GaInPAs cell 104, the GaAs cell 106 and the GaInP cell 108 is a photoelectric conversion cell. Accordingly, it becomes possible to cause a current to flow through a plurality of the photoelectric conversion cells having different band gaps with each other.

The band gaps of the photoelectric conversion cells become narrower (smaller) from a top side to a bottom side along a light incident direction which is illustrated as an arrow in FIG. 1. The band gaps of the GaInP cell 108, the GaAs cell 106 and the GaInPAs cell 104 are 1.9 eV, 1.42 eV and 1.0 eV, respectively.

Each of the tunnel junction layers 105 and 107 is a thin $p^+n^+$-joint layer in which a $p^+$-type semiconductor layer and an $n^+$-type semiconductor layer are joined. In the tunnel junction layer, a conduction band of the $n^+$-type semiconductor layer and a valence band of the $p^+$-type semiconductor layer are degenerated because of a high concentration doping. Since the conduction band and the valence band lap over with each other and sandwich a Fermi level therebetween, a tunneling probability of carriers is increased. Accordingly, it becomes possible to flow the tunnel current from the $p^+$-type semiconductor layer to the $n^+$-type semiconductor layer.

The tunnel junction layer 105 preferably includes a tunnel junction layer in which a $p^+$-type GaInAs layer 105A and an $n^+$-type InP layer 105B are joined (see FIG. 1(A)). Otherwise, the tunnel junction layer 105 preferably includes a tunnel junction layer in which a $p^+$-type AlGaInAs layer 105A1 having a narrower band gap than that of GaAs and the $n^+$-type InP layer 105B (see FIG. 1(B)). Hereinafter, the $p^+$-type GaInAs layer 105A and the $p^+$-type AlGaInAs layer 105A1 may be referred to as a $p^+$-type (Al)GaInAs.

It is possible to fully reduce a resistance of a joint interface of the tunnel junction layer 105 and to make the tunnel current easier to flow from the $n^+$-type semiconductor layer to the $p^+$-type semiconductor layer, by forming the tunnel junction layer 105 in which the $p^+$-type (Al)GaInAs layer and the $n^+$-type InP layer 105B are joined. The joint interface of the tunnel junction layer 105 is a surface at which the p+-type (Al)GaInAs layer and the n+-type InP layer 105B are joined.

The tunnel junction layer 105 may have a configuration in which the $p^+$-type GaInAs layer 105A, the $n^+$-type InP layer 105B and a $p^+$-type GaAs layer 105C are stacked as illustrated in FIG. 2. The $p^+$-type GaAs layer 105C is a highly doped p-type GaAs layer. The GaAs layer 105C is provided between the $p^+$-type GaInAs layer 105A and the GaAs cell 106. In a case where the tunnel junction layer 105 included in a compound photovoltaic cell 120 as illustrated in FIG. 2 has a three-layer-configuration-tunnel-junction-layer including the $p^+$-type GaAs layer 105C, the $p^+$-type GaInAs layer 105A and the $n^+$-type InP layer 105B, it is possible to reduce a thickness of the $p^+$-type GaInAs layer 105A compared with that of the $p^+$-type GaInAs layer 105A included in a two-layer-configuration-tunnel-junction-layer of the compound photovoltaic cell 100 as illustrated in FIG. 1.

An impurity of the $n^+$-type InP layer 105B may be Si (Silicon) or Te (Tellurium), for example. An impurity of the $p^+$-type GaInAs layer 105A, the $p^+$-type AlGaInAs layer 105A1 and the $p^+$-type GaAs layer 105C may be C (Carbon), for example.

Figure 3A:
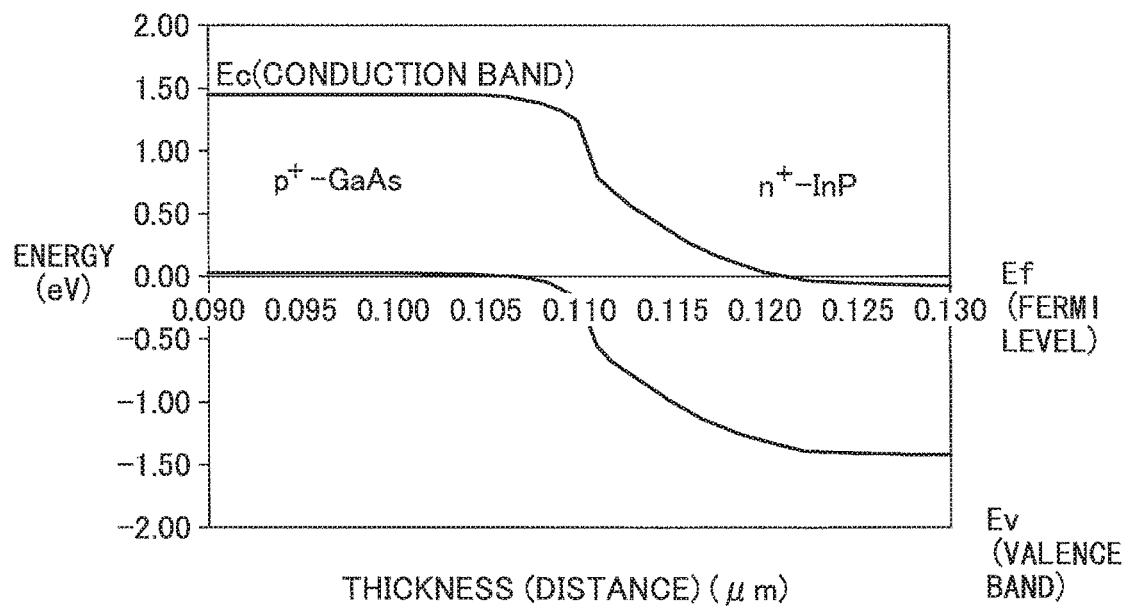
FIG. 3A illustrates a band diagram of a tunnel junction layer according to a comparative example.
Figure 3B:
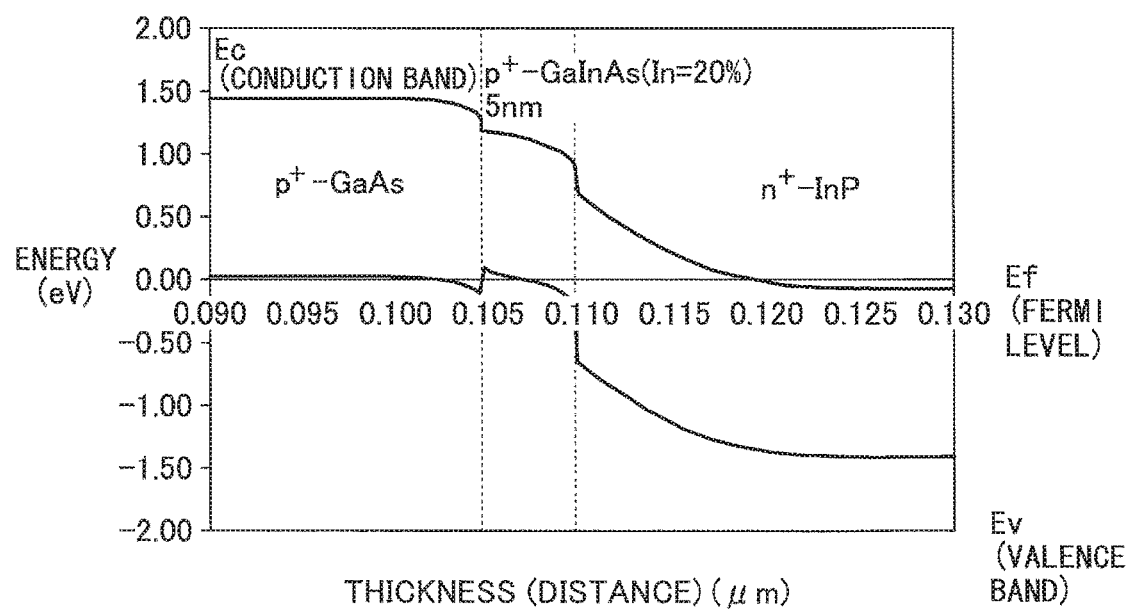
FIG. 3B illustrates a band diagram of a tunnel junction layer according to the first embodiment.

Next, the tunneling probability and the tunnel current will be described with reference to FIG. 3 illustrating a band diagram of tunnel junction layers. FIG. 3A is a diagram illustrating a band diagram of a tunnel junction layer ($p^+$ GaAs/$n^+$ InP) according to a comparative example. FIG. 3B is a band diagram of the tunnel junction layer 105 ($p^+$ GaAs/$p^+$ GaInAs/$n^+$InP) according to the first embodiment. A thickness of the $p^+$-type GaInAs layer 105A is 5 nm, and an In (Indium) composition ratio is 20%. In FIGS. 3A and 3B, horizontal axes represent thicknesses [μm] of the tunnel junction layers, and vertical axes represent energies [eV].

In FIG. 3A, a hole tunnels from a valence band of the $p^+$-type GaAs layer to a conduction band of the $n^+$-type InP layer. An electron tunnels from a conduction band of the $n^+$-type InP layer to a valence band of the $p^+$-type GaAs layer. In FIG. 3B, a hole tunnels from a valence band of the $p^+$-type GaInAs layer 105A to a conduction band of the $n^+$-type InP layer 105B. An electron tunnels from a conduction band of the $n^+$-type InP layer 105B to a valence band of the $p^+$-type GaInAs layer 105A.

As illustrated in FIG. 3B, the valence band of the $p^+$-type GaInAs layer 105A has a convex portion which projects upward. This is because the $p^+$-type GaInAs layer 105A has a narrower band gap than that of the $p^+$-type GaAs layer 105C. Accordingly, a level of the conduction band of the $p^+$-type GaInAs layer 105A is lower than that of the conduction band $p^+$-type GaAs layer 105C, and a level of the valence band of the $p^+$-type GaInAs layer 105A is higher than that of the valence band of the $p^+$-type GaAs layer 105C.

Since a level difference between the valence band of the $p^+$-type GaInAs layer 105A and the conduction band of the $n^+$-type InP layer 105B as illustrated in FIG. 3B is narrower than a level difference between the valence band of the $p^+$-type GaAs layer and the conduction band of the $n^+$-type InP layer as illustrated in FIG. 3A, a depletion layer of the tunnel junction layer 105 as illustrated in FIG. 3B becomes narrower than that of the tunnel junction layer as illustrated in FIG. 3A.

Accordingly, the tunnel junction layer 105 of the first embodiment as illustrated in FIG. 3B has a greater tunneling probability of carriers and a lower resistance at the joint interface than those of the tunnel junction layer as illustrated in FIG. 3A. Herein, carriers existing at the convex portion of the valence band contribute to an increase of the tunneling probability as well. Herein, a $p^+$-type AlGaInAs layer including Al (Aluminum) and having narrower band gap than that of GaAs may be used instead of the $p^+$-type GaInAs layer 105A. A $p^+$-type AlGaAs layer including Al (Aluminum) may be included in the tunnel junction layer 105 instead of the $p^+$ GaAs layer 105C as illustrated in FIG. 2. In this case, the $p^+$-type AlGaInAs layer may be included instead of the $p^+$-type GaInAs layer 105A. AlGaAs and GaAs may be referred to as (Al)GaAs. Accordingly, (Al)GaAs includes GaAs and AlGaAs. It is necessary to design a multi-junction photovoltaic cell such as the compound photovoltaic cell 100 so that currents generated in the cells 104, 106 and 109 have the same values with each other. For example, the compound photovoltaic cell 100 is designed so that the GaAs cell 106 does not absorb all the light in a wavelength range which can be absorbed at the GaAs cell 106 but transmits a part of the light to the GaInPAs cell 104 located on the back side in the incident light direction. In this case, for the sake of suppressing an absorption of the transmitted light at the tunnel junction layer 105 located between the GaAs cell 106 and the GaInPAs cell 104, it is preferable to form the tunnel junction layer 105 by using material such as AlGaAs having wider band gap than that of GaAs. The same applies to other embodiments.

The tunnel junction layer 107 includes a p$^+$-type Al(x)GaAs layer 107A and an n$^+$-type Ga(x)InP layer 107B.

The GaInP cell 108 includes an n-type Al(x)InP layer 108A, an n-type Ga(x)InP layer 108B, a p-type Ga(x)InP layer 108C and a p-type Al(x)InP layer 108D that are formed in this order along the light incident direction. The n-type Al(x)InP layer 108A is a window layer. The p-type Al(x)InP layer 108D is a Back Surface Field (BSF) layer. The GaInP cell 108 may include an antireflection coating or the like on a light incident side.

Composition ratios of Ga (Gallium) of the n-type Ga(x)InP layer 108B and the p-type Ga(x)InP layer 108C are adjusted so that the band gap of the GaInP cell 108 becomes 1.9 eV. Physical properties such as band gap, lattice constant or the like of a binary, a ternary or a quaternary III-V group compound semiconductors can be controlled easily by adjusting composition ratios of mixed crystal semiconductor(s). Accordingly, it becomes possible to set the wavelength range in which a photoelectric conversion cell absorbs the light arbitrarily by utilizing the III-V group compound semiconductor.

An impurity of the n-type Ga(x)InP layer 108B may be Si (Silicon), for example. An impurity of the p-type Ga(x)InP layer 108C may be Zn (Zinc), for example.

The GaAs cell 106 includes an n-type [Al(x)Ga](y)InP layer 106A, an n-type GaAs layer 106B, a p-type GaAs layer 106C and a p-type Ga(x)InP layer 106D that are formed in this order along the light incident direction. The n-type [Al(x)Ga](y)InP layer 106A is a window layer. The p-type Ga(x)InP layer 106D is a Back Surface Field (BSF) layer.

An impurity of the n-type GaAs layer 106B may be Si (Silicon), for example. An impurity of the p-type GaAs layer 106C may be Zn (Zinc), for example.

The GaInPAs cell 104 includes an n-type InP layer 104A, an n-type Ga(x)InP(y)As layer 104B, a p-type Ga(x)InP(y)As layer 104C and a p-type InP layer 104D that are formed in this order along the light incident direction. The n-type InP layer 104A is a window layer. The p-type InP layer 104D is a Back Surface Field (BSF) layer.

Composition ratios x of Ga (Gallium) and composition ratios y of the n-type Ga(x)InP(y)As layer 104B and the p-type Ga(x)InP(y)As layer 104C are adjusted so that the band gap of the GaInPAs cell 104 becomes 1.0 eV.

An impurity of the n-type Ga(x)InP(y)As layer 104B may be Si (Silicon), for example. An impurity of the p-type Ga(x)InP(y)As layer 104C may be Zn (Zinc), for example.

The p-type Ga(x)InP layer (p-type BSF layer) 106D contacts the p$^+$-type GaInAs layer 105A (see FIG. 1A), the p$^+$-type AlGaInAs layer 105A1 (see FIG. 1B) or the p$^+$-type GaAs layer 105C (see FIG. 2) of the tunnel junction layer 105. The p-type Al(x)InP layer (p-type BSF layer) 108D contacts the p$^+$-type Al(x)GaAs layer 107A of the tunnel junction layer 107. The n-type [Al(x)Ga](y)InP layer (n-type window layer) 106A contacts the n$^+$-type Ga(x)InP layer 107B of the tunnel junction layer 107. The n-type InP layer (n-type window layer) 104A contacts the n$^+$-type InP layer 105B of the tunnel junction layer 105. It becomes possible to flow the current smoothly through the photoelectric conversion cells, i.e. through the GaInPAs cell 104, the GaAs cell 106 and the GaInP cell 108 by forming layers of the tunnel junction layers 105 and 106 that contact the BSF layers or the window layers and have the same conductive type as that of the BSF layers or the window layers as described above.

The materials of the photoelectric conversion cells are not limited to above described materials such as InP, GaAs and GaInP. However, it is preferable to form the GaInPAs cell 104 located between the InP substrate 103 and the n$^+$-type InP layer 105B by using an InP lattice matching material. Further, it is preferable to form the GaAs cell 106 and the GaInP cell 108 located between the p$^+$-type GaInAs layer 105A and the contact layer 109 by using a GaAs lattice matching material.

The contact layer 109 may be an n$^+$-type GaAs layer, for example. It is preferable to form the contact layer 109 so that the contact layer 109 has a smaller planar dimension than that of the GaInP cell 108. This is for the sake of reducing light absorption of the contact layer 109 and increasing an incident light of the GaInP cell 108.

The electrodes 101 and 102 may be made of Ti, Pt, Au or the like. Each of the electrodes 101 and 102 may include a single layer made of one of the materials as described above or include a plurality of layers made of the materials as described above.

Figure 4:
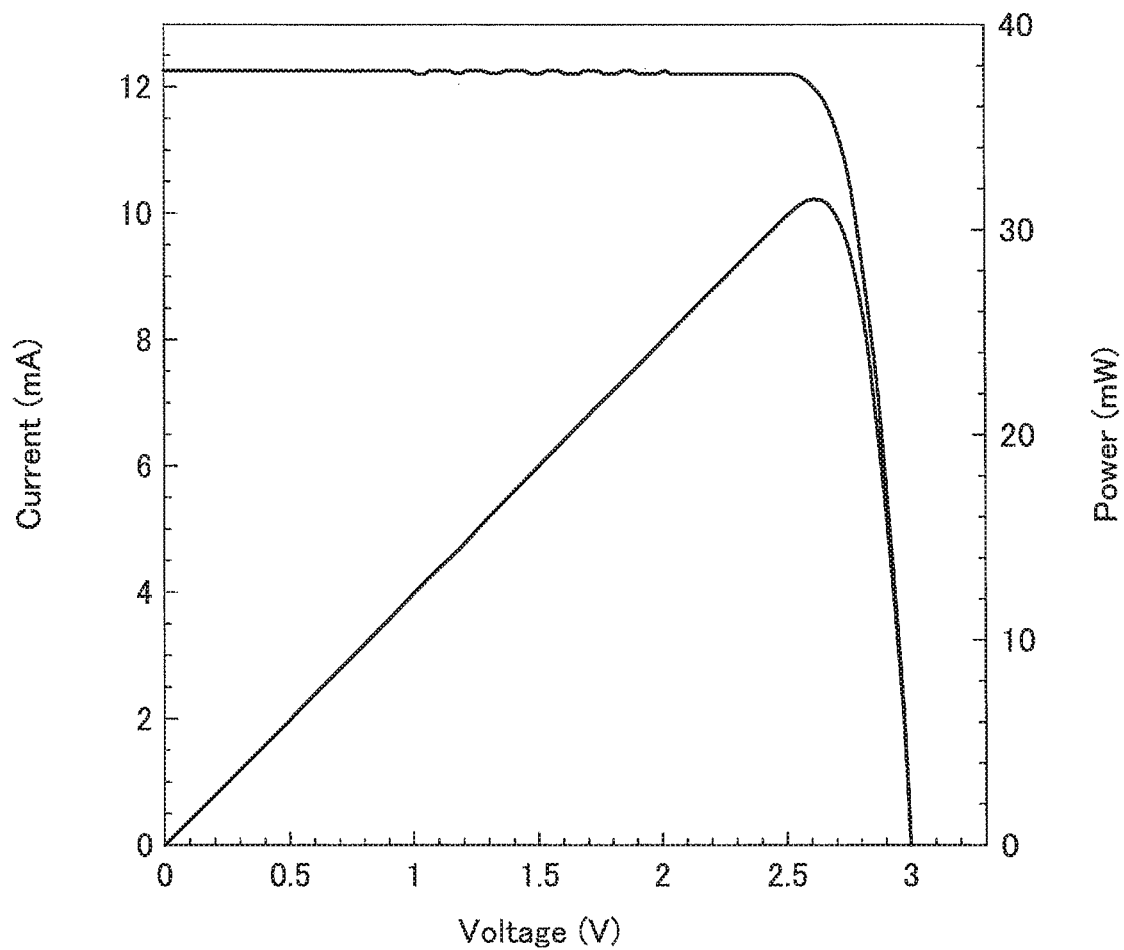
FIG. 4 illustrates an I-V curve of the compound photovoltaic cell.

The conversion efficiency of the compound photovoltaic cell 100 can be determined based on a I-V curve as illustrated in FIG. 4. The conversion efficiency becomes higher if a current and a voltage become greater and the I-V curve has a square shape as illustrated in FIG. 4. In a case where the I-V curve has a triangular shape, an adequate current is not obtained in accordance with an increase of the voltage. As a result, the conversion efficiency becomes lower.

Since the tunnel junction layer 105 is formed of the p$^+$-type GaInAs layer 105A and the n$^+$-type InP layer 105B, it becomes possible to reduce the resistance of the tunnel joint interface of the tunnel junction layer 105. Since the compound photovoltaic cell 100 includes a plurality of the photoelectric conversion cells that constitute a multi-junction configuration having different band gaps with each other, it becomes possible to absorb the sunlight in a wide wavelength range. Accordingly, the conversion efficiency of the compound photovoltaic cell 100 is enhanced.

Next, a production method of the compound photovoltaic cell 120 according to the first embodiment is described with reference to FIGS. 5A, 5B, 6, 7 and 8. FIGS. 5A, 5B, 6, 7 and 8 are diagrams illustrating the production processes of the compound photovoltaic cell 120 according to the first embodiment.

As illustrated in FIG. 5, a layered body 100A is formed on a GaAs substrate 110, and a layered body 100B is formed on the InP substrate 103. A production method of the layered body 100A and 100B may be a Metal Organic Chemical Vapor Deposition (MOCVD) method, a Molecular Beam Epitaxy (MBE) method or the like. A substrate other than the InP substrate 103 and the GaAs substrate 110 may be used. For example, a combination of a GaSb substrate and a GaAs substrate, a combination of a Si substrate and a GaAs substrate or the like may be used instead of a combination of the InP substrate 103 and the GaAs substrate 110.

Figure 5B:
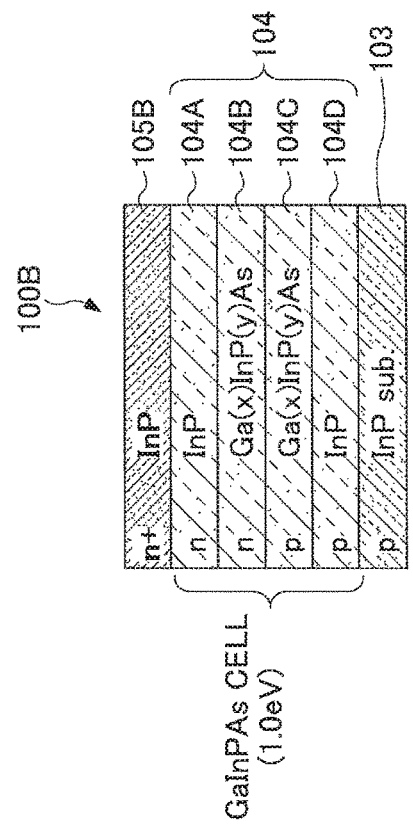
FIGS. 5A and 5B illustrate production processes of the compound photovoltaic cell according to the first embodiment.
Figure 5A:
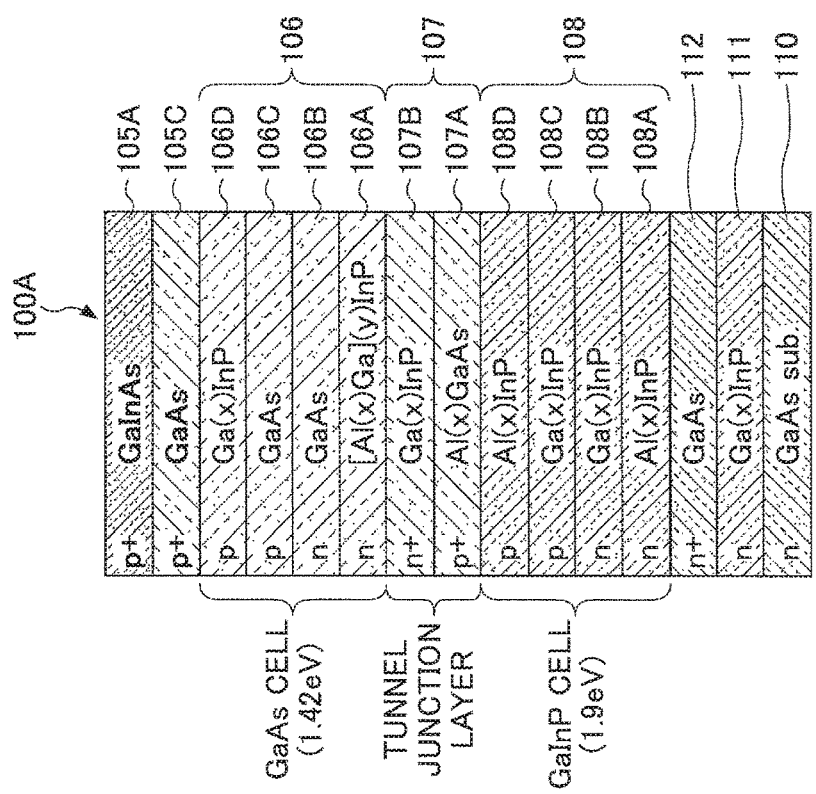

The layered body 100A is formed by depositing an etch-stop-layer 111, a contact layer 112, the GaInP cell 108, the tunnel junction layer 107, the GaAs cell 106, the p$^+$-type GaAs layer 105C and the p$^+$-type GaInAs layer 105A onto the GaAs substrate 110 in this order (see FIG. 5A).

The GaAs cell 106 and the GaInP cell 108 are lattice matched with the GaAs substrate 110. A lattice constant of GaAs is about 5.65 Å. It is preferable to adjust the composition ratio of each layer included in the III-V group compound semiconductor material so that lattice constants of the GaAs cell 106 and the GaInP cell 108 formed on the GaAs substrate 110 become close to 5.65 Å.

The layered body 100B is formed by depositing the GaInPAs cell 104 and the $n^+$-type InP layer 105B onto the InP substrate 103 in this order (see FIG. 5B).

The GaInPAs cell 104 is lattice matched with the InP substrate 103. A lattice constant of InP is about 5.87 Å. It is preferable to adjust the composition ratio of each layer included in the III-V group compound semiconductor material so that lattice constant of the GaInPAs cell 104 formed on the InP substrate 103 become close to 5.87 Å.

Since the lattice constant of the GaAs cell 106 and the GaInP cell 108 and the lattice constant of the GaInPAs cell 104 are different from each other, it is difficult to form the GaAs cell 106, the GaInP cell 108 and the GaInPAs cell 104 onto a single substrate. Accordingly, the layered body 100A and the layered body 100B are formed separately.

It is preferable to adjust the lattice constant of the $p^+$-type GaInAs layer 105A or the $p^+$-type AlGaInAs layer 105A1 so that the lattice constant becomes closer to a lattice constant of the GaAs substrate 110 rather than a lattice constant of the InP substrate 103.

Figure 6:
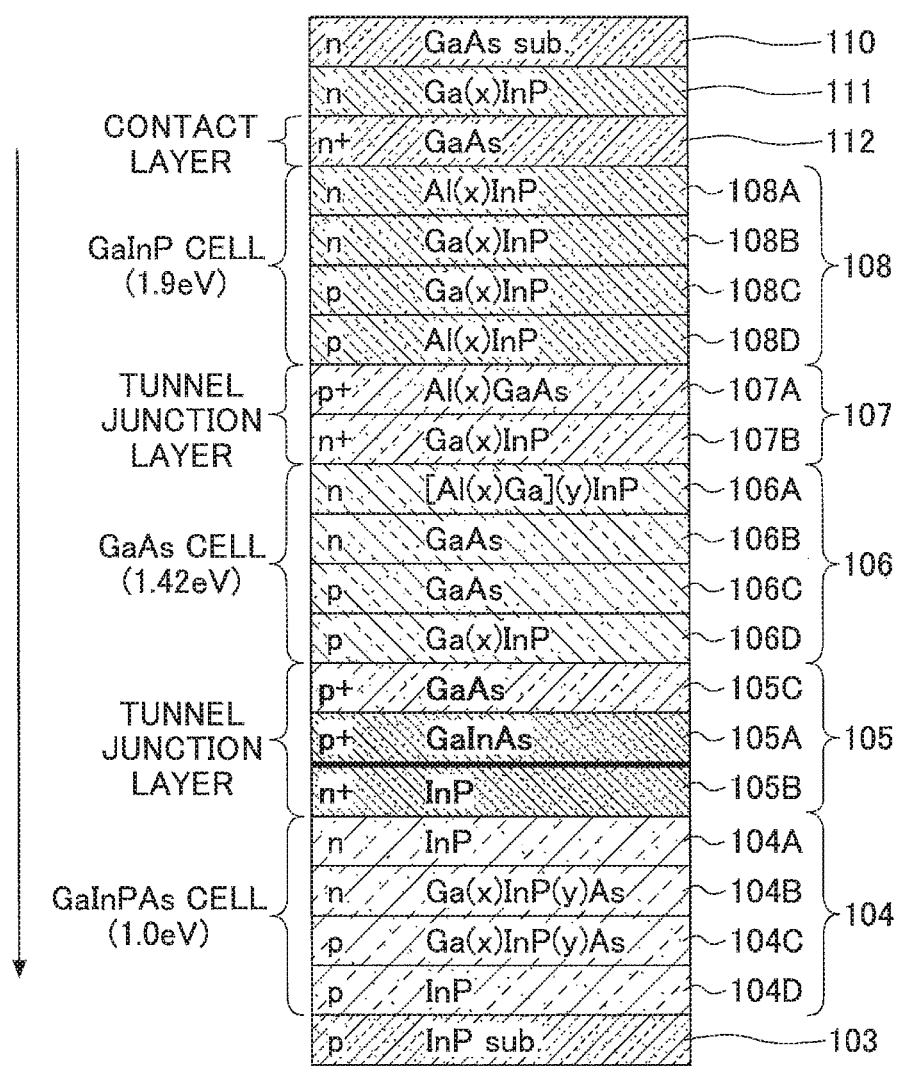
FIG. 6 illustrates production processes of the compound photovoltaic cell according to the first embodiment.

Next, the layered body 100A which includes epitaxially-grown photoelectric conversion cells formed on the GaAs substrate 110 and the layered body 100B which includes an epitaxially grown photoelectric conversion cell formed on the InP substrate 103 are bonded directly as illustrated in FIG. 6.

A cleaning process and a surface activation treatment are performed to the surface of the $p^+$-type GaInAs layer 105A and the surface of the $n^+$-type InP layer 105B. The GaInAs layer 105A is a top layer of the layered body 100A and the $n^+$-type InP layer 105B is a top layer of the layered body 100B. Then the surface of the $p^+$-type GaInAs layer 105A and the surface of the $n^+$-type InP layer 105B are bonded in a vacuum. A nitrogen plasma ($N_2$ plasma) treatment or the like is performed as the surface activation treatment. It is preferable to bond the surfaces at about 150° C.

Figure 7:
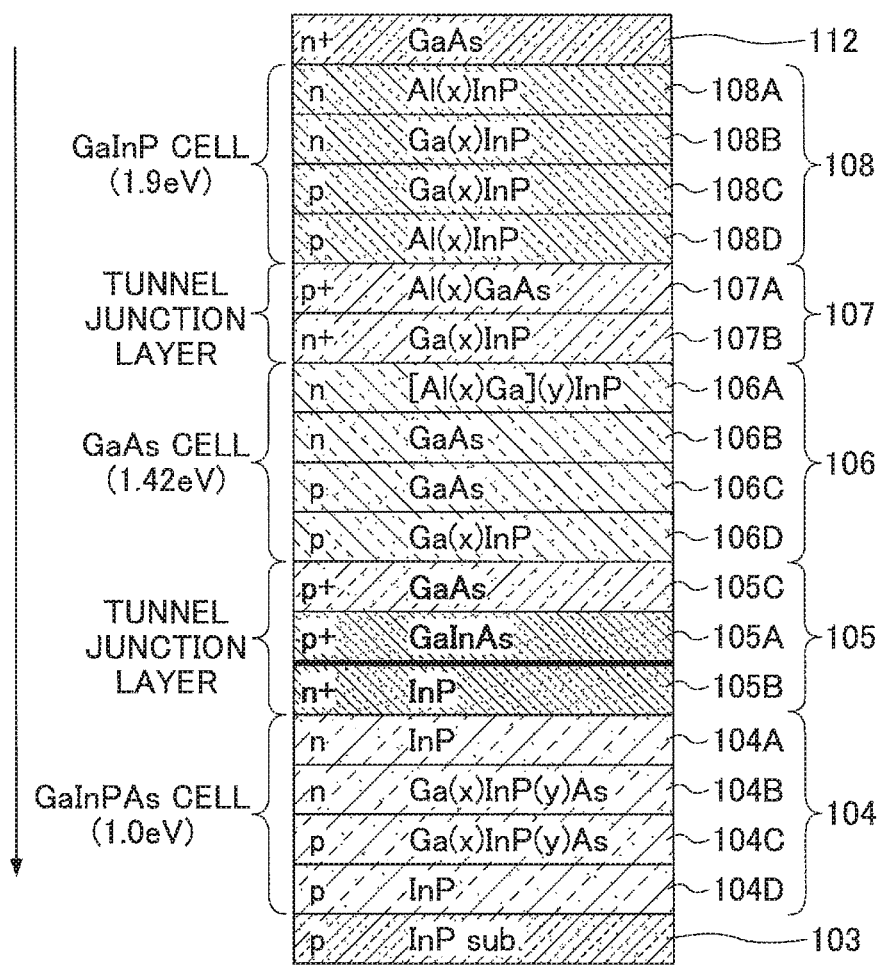
FIG. 7 illustrates production processes of the compound photovoltaic cell according to the first embodiment.

Next, the GaAs substrate 110 and the etch-stop-layer 111 are selectively etched and removed as illustrated in FIG. 7.

The GaAs substrate 110 is etched by a wet etching or the like. In this case, an etching solution is a mixed solution of sulfuric acid ($H_2SO_4$), hydrogen peroxide ($H_2O_2$) and water ($H_2O$), for example. Since the mixed solution does not dissolve GaInP used as the etch-stop-layer 111, it is possible to stop the etching process in front of the etch-stop-layer 111. Accordingly, only the GaAs substrate 110 is etched accurately.

The etch-stop-layer 111 is etched by a wet etching or the like. In this case, an etching solution is a mixed solution of hydrochloric acid (HCl) and water ($H_2O$), for example.

By performing these etching processes, the GaAs substrate 110 and the etch-stop-layer 111 are selectively removed from the layered body 100A.

Next, a photo resist is applied on the contact layer 112, and then the photo resist is patterned by performing an exposure and a development that can be realized by a known photolithography process utilizing a photolithography machine. Accordingly, a patterned resist is formed on the contact layer 112. Next, an electrode material is vapor-deposited on the contact layer 112 and the patterned resist by performing a vacuum deposition method or the like, in order to deposit a metallic film. The electrode 101 is formed on the contact layer 112 by lifting off the metallic film formed on the patterned resist.

Next, the contact layer 109 is formed by removing a part of the contact layer 112 which is not stacked with the electrode 101. The removing process is performed by wet etching utilizing the electrode 101 as a mask.

In this case, an etching solution is a mixed solution of sulfuric acid ($H_2SO_4$), hydrogen peroxide ($H_2O_2$) and water ($H_2O$), for example. Since the mixed solution does not dissolve the AlInP included in the GaInP cell 108, it is possible to stop the etching process in front of the n-type Al(x)InP layer 108A. Accordingly, only the contact layer 112 is etched accurately.

Next, the electrode 102 is formed under the InP substrate 103. The electrode 102 may be formed by performing a similar process to that of the electrode 101. The electrode 102 may be formed after polishing the InP substrate 103 to a designated thickness.

Figure 8:
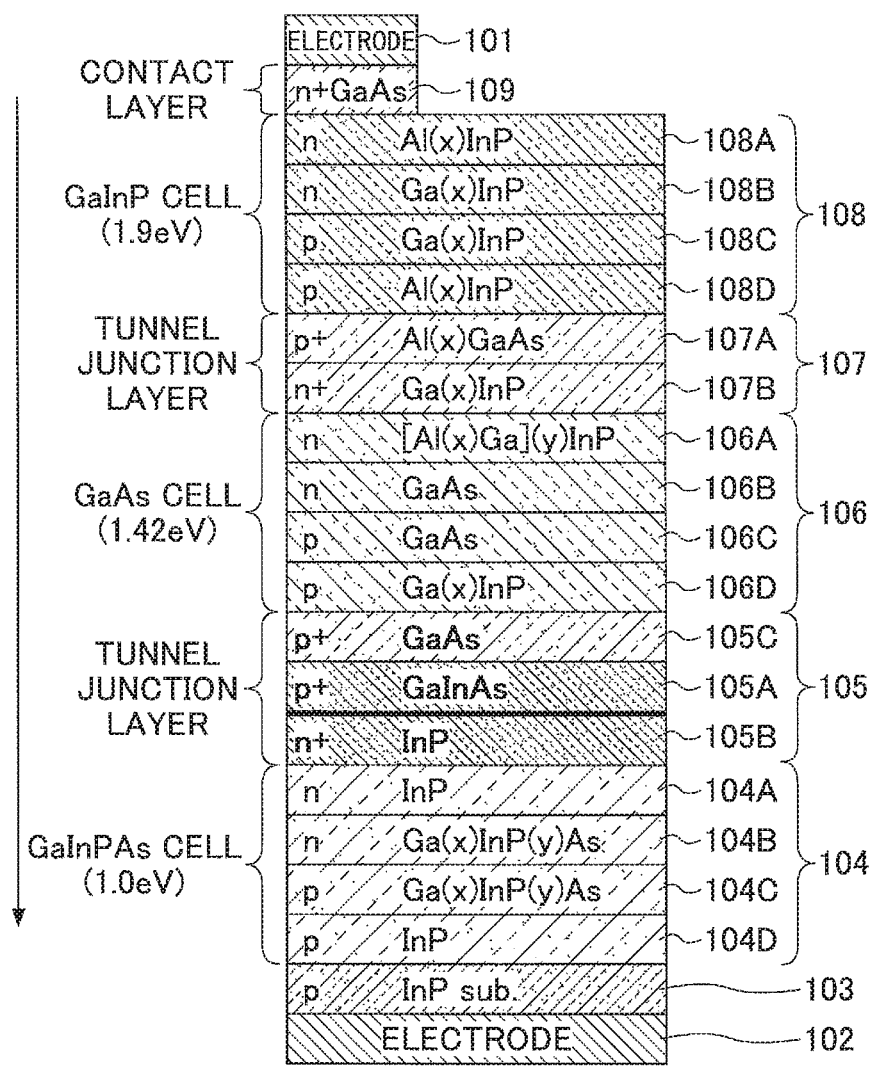
FIG. 8 illustrates production processes of the compound photovoltaic cell according to the first embodiment.

By performing the processes as described above, the compound photovoltaic cell 120 is completed as illustrated in FIG. 8.

According to the first embodiment, the production method of the compound photovoltaic cell 120 including the tunnel junction layer 105 having a three-layered configuration including the $p^+$-type GaAs layer 105C, the $p^+$-type GaInAs layer 105A and the $n^+$-type InP layer 105B is described. If the number of layers included in the tunnel junction layer 105 is varied, a compound photovoltaic cell including the varied tunnel junction layer 105 can be formed by a production method similar to the production method as described above.

For example, in a case where the tunnel junction layer 105 has a two layered configuration including the $p^+$-type GaInAs layer 105A and the $n^+$-type InP layer 105B, the compound photovoltaic cell 100 can be formed by a production method similar to the production method as described above. Further, for example, in a case where the tunnel junction layer 105 has a two layered configuration including $p^+$-type AlGaInAs layer 105A1 and the $n^+$-type InP layer 105B, the compound photovoltaic cell 100 can be formed by a production method similar to the production method as described above.

The compound photovoltaic cells 100 and 120 have the tunnel junction layers 105 in which the $p^+$-type GaInAs layer 105A (or the $p^+$-type AlGaInAs layer 105A1) and the $n^+$-type InP layer 105B are joined at the joint interface of the layered body 100A and the layered body 100B. Accordingly, the resistance at the joint interface is reduced and it becomes easier for the tunnel current to flow through the tunnel junction layer 105. Therefore, it is possible to enhance the conversion efficiency of the compound photovoltaic cells 100 and 120.

Second Embodiment

In the second embodiment, a compound photovoltaic cell having a configuration different from that of the compound photovoltaic cells 100 and 120 of the first embodiment is described.

Figure 9:
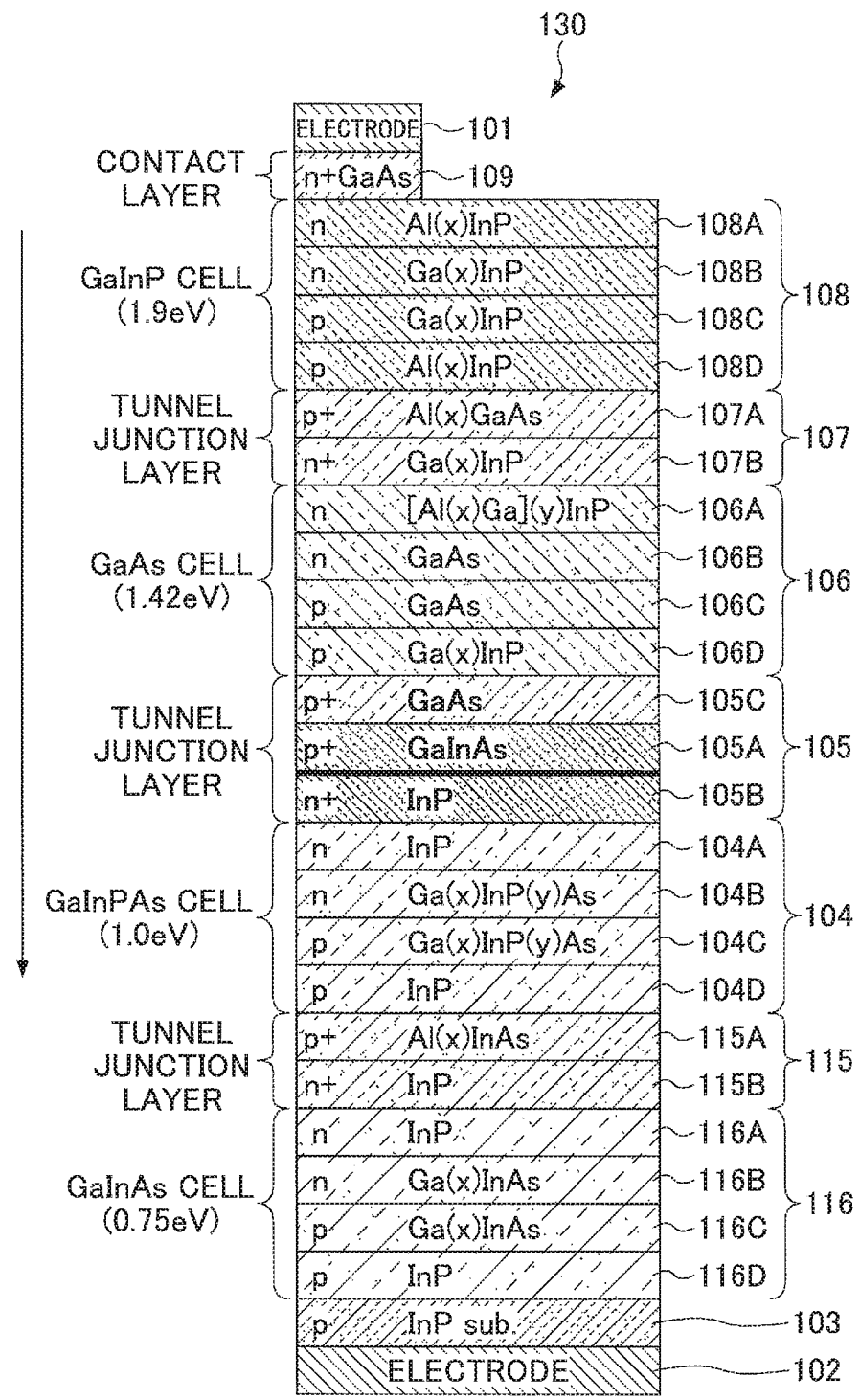
FIG. 9 illustrates a compound photovoltaic cell according to a second embodiment.

FIG. 9 is a diagram illustrating a compound photovoltaic cell 130 according to the second embodiment.

As illustrated in FIG. 9, the compound photovoltaic cell 130 includes four photoelectric conversion cells and three tunnel junction layers. Otherwise, the compound photovoltaic cell 130 includes the same configuration as that of the compound photovoltaic cell 120 as illustrated in FIG. 2.

A GaInAs cell 116 is formed on the InP substrate 103 and a tunnel junction layer 115 is formed between the GaInAs cell 116 and the GaInPAs cell 104.

In the compound photovoltaic cell 130, band gaps of the photoelectric conversion cells becomes smaller from an incident side to a back side along a light incident direction. The band gaps of the GaInP cell 108, the GaAs cell 106, the GaInPAs cell 104 and the GaInAs cell 116 are 1.9 eV, 1.42 eV, 1.0 eV and 0.75 eV, respectively.

The tunnel junction layer 115 includes a p$^+$-type Al(x)InAs layer 115A and a n$^+$-type InP layer 115B. The p$^+$-type Al(x)InAs layer 115A and the n$^+$-type InP layer 115B are highly doped layers.

The GaInAs cell 116 includes an n-type InP layer 116A, an n-type Ga(x)InAs layer 116B, a p-type Ga(x)InAs layer 116C and a p-type InP layer 116D that are formed in this order along the light incident direction. The n-type InP layer 116A is a window layer. The p-type InP layer 116D is a Back Surface Field (BSF) layer.

Composition ratios of Ga (Gallium) of the n-type Ga(x)InAs layer 116B and the p-type Ga(x)InAs layer 116C are adjusted so that the band gap of the GaInAs cell 116 becomes 0.75 eV.

An impurity of the n-type Ga(x)InAs layer 116B may be Si (Silicon), for example. An impurity of the p-type Ga(x)InAs layer 116C may be Zn (Zinc), for example.

The compound photovoltaic cell 130 is a four-junction photovoltaic cell including the GaInP cell 108, the GaAs cell 106, the GaInPAs cell 104 and the GaInAs cell 116 of which the band gaps are 1.9 eV, 1.42 eV, 1.0 eV and 0.75 eV, respectively. The four-junction photovoltaic cell has well balanced band gaps as described above. Therefore, the compound photovoltaic cell 130 can further enhance energy conversion efficiency of the sunlight compared with the three-junction photovoltaic cell.

According to the second embodiment, it is possible to obtain a compound photovoltaic cell 130 with high conversion efficiency.

Third Embodiment

In the third embodiment, a compound photovoltaic cell having a configuration different from that of the compound photovoltaic cells 100 and 120 of the first embodiment is described.

Figure 10:
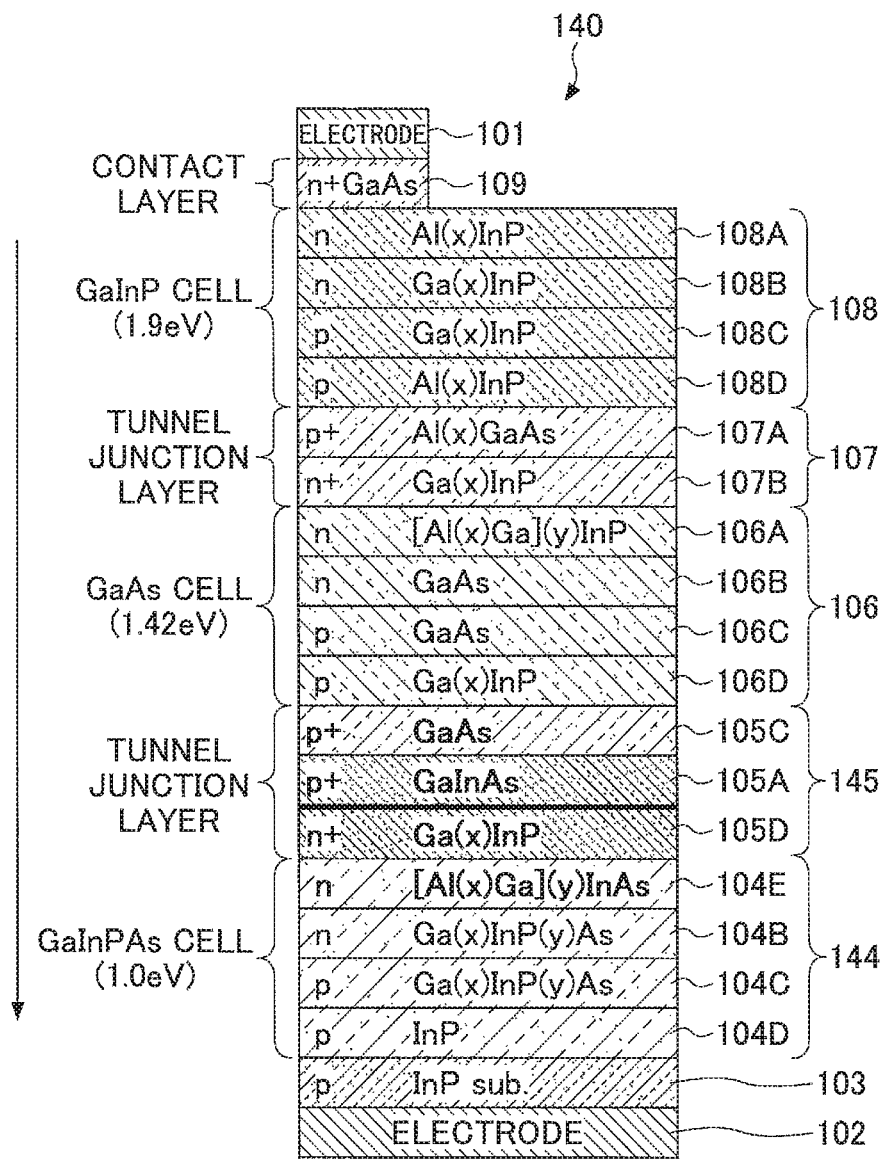
FIG. 10 illustrates a compound photovoltaic cell according to a third embodiment.

FIG. 10 is a diagram illustrating a compound photovoltaic cell 140 according to the third embodiment.

As illustrated in FIG. 10, the compound photovoltaic cell 140 includes a tunnel junction layer 145 and a GaInPAs cell 144 instead of the tunnel junction layer 105 and the GaInPAs cell 104 as illustrated in FIG. 2. The tunnel junction layer 145 includes the p$^+$-type GaInAs layer 105A, the p$^+$-type GaAs layer 105C and an n$^+$-type Ga(x)InP layer 105D. The n$^+$-type Ga(x)InP layer 105D have a tensile strain with respect to InP. The n$^+$-type Ga(x)InP layer 105D is provided instead of the n$^+$-type InP layer 105B and functions as an n$^+$-type tunnel junction layer of the tunnel junction layer 145. The GaInPAs cell 144 includes a [Al(x)Ga](y)InAs layer 104E, the n-type Ga(x)InP(y)As layer 104B, the p-type Ga(x)InP(y)As layer 104C and the p-type InP layer 104D. The [Al(x)Ga](y)InAs layer 104E is provided instead of the n-type InP layer 104A and functions as a window layer of the GaInPAs cell 144. Otherwise, the compound photovoltaic cell 140 includes the same configuration as that of the compound photovoltaic cell 120 as illustrated in FIG. 2.

The n$^+$-type Ga(x)InP layer 105D is highly doped. With regard to the n$^+$-type Ga(x)InP layer 105D, a composition ratio of Ga is 10%, a tensile strain is 0.7% and a band gap is 1.42 eV. It is necessary to adjust a thickness of the n$^+$-type Ga(x)InP layer 105D so that the n$^+$-type Ga(x)InP layer 105D does not have a lattice relaxation.

It is preferable that the n$^+$-type tunnel junction layer (n$^+$-type Ga(x)InP layer 105D) be made of a material having a band gap greater than or equal to the band gap of the photoelectric conversion cell (for example, the GaAs cell 106) which is located next to the n$^+$-type tunnel junction layer 105D on the back side in the light incident direction. The material may be GaPSb, GaInPSb, AlInAs, AlGaInAs, AlAsSb, AlGaAsSb, AlPSb, AlGaPSb, AlInPSb or the like other than GaInP, for example.

It is preferable that the window layer (n-type InP layer 104A) is made of a material having a band gap greater than or equal to the band gap of the photoelectric conversion cell (for example, the GaAs cell 106) which is located next to the window layer on the incident side in the light incident direction. Accordingly, the band gap of the [Al(x)Ga](y)InAs layer 104E is more than or equal to 1.42 eV, preferably more than or equal to 1.5 eV. It is possible to cause a long-wavelength-light transmitting through the GaAs cell 106 to enter the GaInPAs cell 144 by forming the window layer having the band gap as described above between the GaAs cell 106 (1.42 eV) and the GaInPAs cell 144 (1.0 eV).

The material of the window layer may be GaInP, GaPSb, GaInPSb, AlInAs, AlGaInAs, AlAsSb, AlGaAsSb, AlPSb, AlGaPSb, AlPSb, AlInPSb or the like other than AlGaInAs for example.

In a conventional compound photovoltaic cell, an InP (1.35 eV) layer has been widely used for an n$^+$-type tunnel junction layer (wafer joint layer) or a window layer. Since the InP (1.35 eV) layer absorbs a part of the light transmitting through a GaAs cell (1.42 eV), conversion efficiency of the conventional compound photovoltaic cell is decreased. It is possible to cause the long-wavelength light transmitting through the GaAs cell 106 (1.42 eV) to enter the GaInPAs cell 144 by selecting the material having the appropriate band gap for the n$^+$-type tunnel junction layer (n$^+$-type Ga(x)InP layer 105D) and the window layer ([Al(x)Ga](y)InAs layer 104E) as described above. As a result, the conversion efficiency of the compound photovoltaic cell 140 is enhanced.

According to the third embodiment, it is possible to obtain a compound photovoltaic cell 140 with high conversion efficiency.

Fourth Embodiment

In the fourth embodiment, a compound photovoltaic cell having a configuration different from that of the compound photovoltaic cells 100 and 120 of the first embodiment is described.

Figure 11:
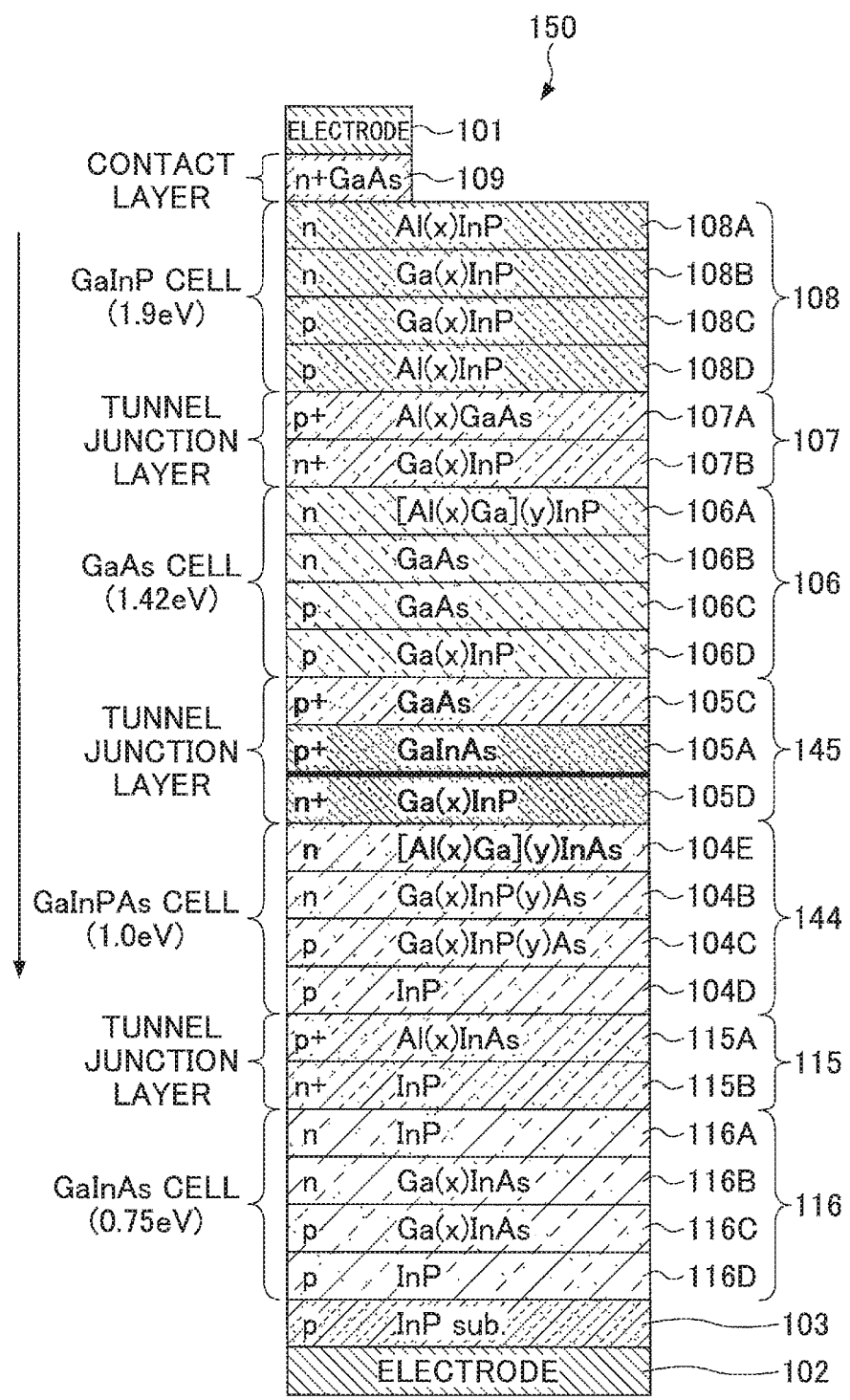
FIG. 11 illustrates a compound photovoltaic cell according to a fourth embodiment.

FIG. 11 is a diagram illustrating a compound photovoltaic cell 150 according to a fourth embodiment;

As illustrated in FIG. 11, the compound photovoltaic cell 150 includes four photoelectric conversion cells and three tunnel junction layers. As illustrated in FIG. 11, a compound photovoltaic cell 150 includes a tunnel junction layer 145 and a GaInPAs cell 144 instead of the tunnel junction layer 105 and the GaInPAs cell 104 as illustrated in FIG. 2. The tunnel junction layer 145 includes the p$^+$-type GaInAs layer 105A, the p$^+$-type GaAs layer 105C and an n$^+$-type Ga(x)InP layer 105D. The n$^+$-type Ga(x)InP layer 105D has a tensile strain with respect to InP. The n$^+$-type Ga(x)InP layer 105D is provided instead of the n$^+$-type InP layer 105B and functions as an n$^+$-type tunnel junction layer of the tunnel junction layer 145. The GaInPAs cell 144 includes a [Al(x)Ga](y)InAs layer 104E, the n-type Ga(x)InP(y)As layer 104B, the p-type Ga(x)InP(y)As layer 104C and the p-type InP layer 104D. The [Al(x)Ga](y)InAs layer 104E is provided instead of the n-type InP layer 104A and functions as a window layer of the GaInPAs cell 144. Otherwise, the compound photovoltaic cell 150 includes the same configuration as that of the compound photovoltaic cell 130 as illustrated in FIG. 9.

A GaInAs cell 116 is formed on the InP substrate 103 and a tunnel junction layer 115 is formed between the GaInAs cell 116 and the GaInPAs cell 144.

The tunnel junction layer 145 includes the $p^+$-type GaAs layer 105C, the $p^+$-type GaInAs layer 105A and the $n^+$-type Ga(x)InP layer 105D. The $p^+$-type GaAs layer 105C, the $p^+$-type GaInAs layer 105A and the $n^+$-type Ga(x)InP layer 105D are highly doped layers. With regard to the $n^+$-type Ga(x)InP layer 105D, a composition ratio of Ga is 10% and a tensile strain with respect to InP is 0.7%.

The compound photovoltaic cell 150 is a four-junction photovoltaic cell including the GaInP cell 108, the GaAs cell 106, the GaInPAs cell 144 and the GaInAs cell 116 of which the band gaps are 1.9 eV, 1.42 eV, 1.0 eV and 0.75 eV, respectively.

It is possible to enhance the conversion efficiency of the compound photovoltaic cell 150 by selecting appropriate materials for the $n^+$-type tunnel junction layer and the window layer having appropriate band gaps and by including a multi-junction configuration as described above.

A $p^+$-type AlGaAs layer including Al (Aluminum) may be included in the tunnel junction layer 145 instead of the $p^+$ GaAs layer 105C as illustrated in FIG. 11. In this case, the $p^+$-type AlGaInAs layer may be included instead of the $p^+$-type GaInAs layer 105A. It is necessary to design the multi-junction photovoltaic cell so that currents generated in the cells have the same current values. The compound photovoltaic cell 150 is designed so that the GaAs cell 106 does not absorb all the light in a wavelength range which can be absorbed at the GaAs cell 106 but transmits a part of the light to the GaInPAs cell 144 and the GaInAs cell 116 located on the back side in the incident light direction with respect to the GaAs cell 106. In this case, for the sake of suppressing an absorption of the transmitted light at the tunnel junction layer 145 located between the GaAs cell 106 and the GaInPAs cell 144, it is preferable to form the tunnel junction layer 145 by using material such as AlGaAs having a wider band gap than that of GaAs.

In a case where there is a single cell formed on the InP substrate 103 as described in the first and third embodiments, it is not necessary to divide the light transmitting through the GaInP cell 108 and the GaAs cell 106. However, in a case where there is a plurality of cells formed on the InP substrate 103, it is necessary to divide the light transmitting through the GaInP cell 108 and the GaAs cell 106 in accordance with the number of the cells. Accordingly, it is necessary to reduce an absorption of the light to a maximum extent at layers located between a cell which is formed on the GaAs substrate 110 (see FIG. 5A) and is located on the backmost side in the light incident direction and a cell which is formed on the InP substrate 103 and is located on the foremost side in the light incident direction. The foremost side is opposite to the backmost side. An example of the cell which is formed on the GaAs substrate 110 (see FIG. 5A) and is located on backmost side in the light incident direction is the GaAs cell 106 (see FIG. 5A). An example of the cell which is formed on the InP substrate 103 and is located on the foremost side in the light incident direction is the GaInPAs cell 144 (see FIGS. 5B and 11). According to the fourth embodiment, it is possible to reduce an absorption of the light at the tunnel junction layer 145 by using the $n^+$ tunnel junction layer (wafer joint layer) made of GaInP or Ga(In)PSb having a wide band gap and the $p^+$ layer made of AlGaAs having a wide band gap. Accordingly, it becomes possible to cause the light transmitting through the tunnel junction layer 145 to enter the cell(s) formed on the InP substrate 103 efficiently. As a result, the conversion efficiency is enhanced.

According to the fourth embodiment, it is possible to obtain the compound photovoltaic cell 150 with high conversion efficiency. Herein, Ga(In)PSb includes GaPSb and GaInPSb.

Fifth Embodiment

In the fifth embodiment, a compound photovoltaic cell having a configuration different from that of the compound photovoltaic cells 100 and 120 of the first embodiment is described.

Figure 12:
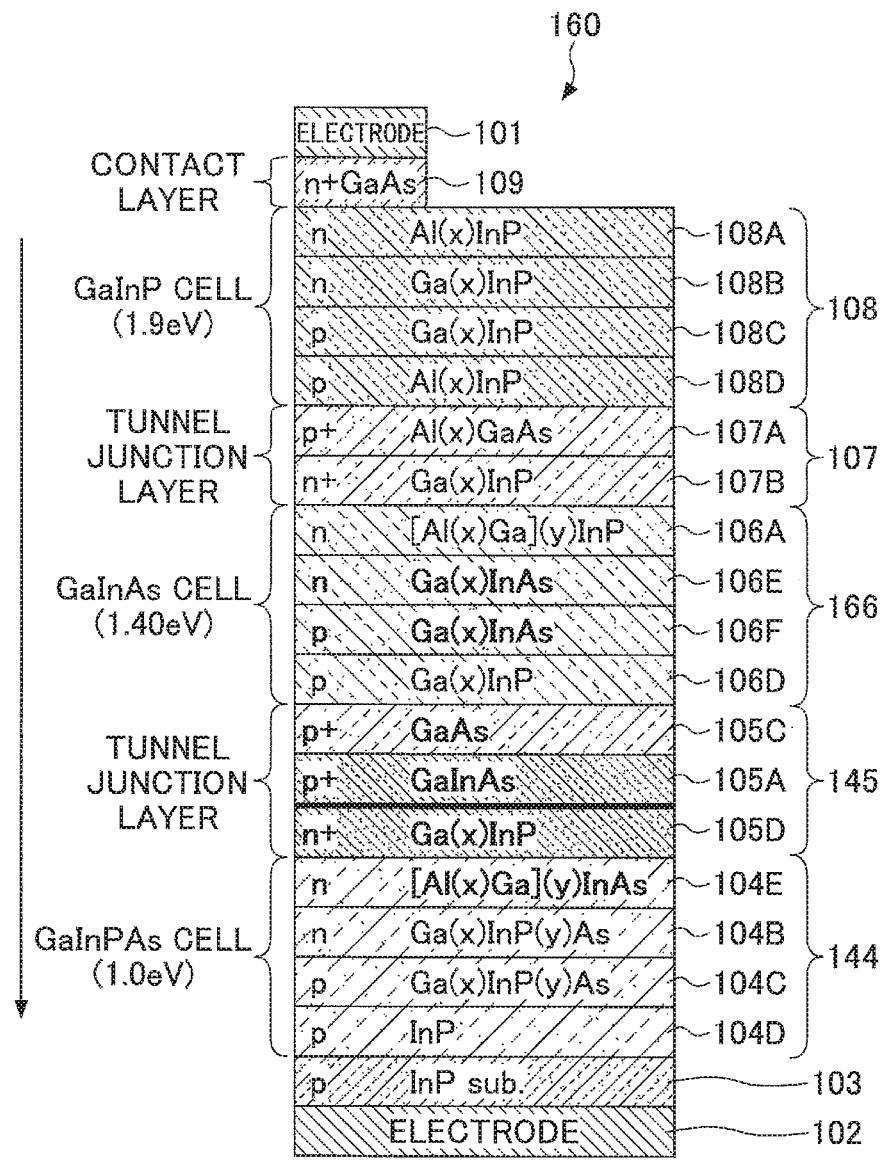
FIG. 12 illustrates a compound photovoltaic cell according to a fifth embodiment.

FIG. 12 is a diagram illustrating a compound photovoltaic cell 160 according to a fifth embodiment;

As illustrated in FIG. 12, the compound photovoltaic cell 160 includes a tunnel junction layer 145 and a GaInPAs cell 144 instead of the tunnel junction layer 105 and the GaInPAs cell 104 as illustrated in FIG. 2. The tunnel junction layer 145 includes the $p^+$-type GaInAs layer 105A, the $p^+$-type GaAs layer 105C and an $n^+$-type Ga(x)InP layer 105D. The $n^+$-type Ga(x)InP layer 105D has a tensile strain with respect to InP. The $n^+$-type Ga(x)InP layer 105D is provided instead of the $n^+$-type InP layer 105B and functions as an $n^+$-type tunnel junction layer of the tunnel junction layer 145. The GaInPAs cell 144 includes a [Al(x)Ga](y)InAs layer 104E, the n-type Ga(x)InP(y)As layer 104B, the p-type Ga(x)InP(y)As layer 104C and the p-type InP layer 104D. The [Al(x)Ga](y)InAs layer 104E is provided instead of the n-type InP layer 104A and functions as a window layer of the GaInPAs cell 144. The compound photovoltaic cell 160 includes a GaInAs cell 166 instead of the GaAs cell 106. The GaInAs cell 166 includes an n-type [Al(x)Ga](y)InP layer 106A, an n-type Ga(x)InAs layer 106E, a p-type Ga(x)InAs layer 106F and a p-type Ga(x)InP layer 106D. The n-type Ga(x)InAs layer 106E and the p-type Ga(x)InAs layer 106F have compression strains. Other than the GaInAs cell 166 including the n-type Ga(x)InAs layer 106E and the p-type Ga(x)InAs layer 106F, the compound photovoltaic cell 160 has the same configuration as that of the compound photovoltaic cell 140 as illustrated in FIG. 10.

The $n^+$-type Ga(x)InP layer 105D is highly doped. With regard to the $n^+$-type Ga(x)InP layer 105D, a composition ratio of Ga is 7.0%, a tensile strain is 0.5% and a band gap is 1.40 eV.

With regard to the n-type Ga(x)InAs layer 106E and the p-type Ga(x)InAs layer 106F, composition ratios of In (Indium) are 1.5%, tensile strains with respect to InP are 0.1% and band gaps are 1.40 eV. The n-type Ga(x)InAs layer 106E and the p-type Ga(x)InAs layer 106F have the same composition ratio of In, tensile strain and band gap with each other. In a case where the tensile strain is about 0.1%, the Ga(x)InAs layers 106E and 106F can have thicknesses that enable the Ga(x)InAs layers 106E and 106F to absorb adequate light and perform as a photoelectric conversion cell.

In a conventional compound photovoltaic cell, an InP (1.35 eV) layer has been widely used for an $n^+$-type tunnel junction layer (wafer joint layer) or a window layer. Since the InP (1.35 eV) layer absorbs a part of the light transmitting through a GaAs cell (1.42 eV), conversion efficiency of the conventional compound photovoltaic cell is decreased. It is possible to cause the long-wavelength light transmitting through the GaInAs cell 166 (1.40 eV) to enter the GaInPAs cell 144 by selecting the material having the appropriate band gap for the $n^+$-type tunnel junction layer ($n^+$-type Ga(x)InP layer 105D) and the window layer ([Al(x)Ga](y)InAs layer 104E) as described above. As a result, the conversion efficiency of the compound photovoltaic cell 160 is enhanced.

According to the fifth embodiment, it is possible to use the $n^+$-type tunnel junction layer (wafer joint layer) and the window layer having narrower band gaps than the band gaps of the $n^+$-type tunnel junction layer (wafer joint layer) and the window layer according to the third and fourth embodiments by including the GaInAs cell 166 (1.40 eV) instead of the GaAs cell 106 (1.42 eV). Small strain is enough for realizing the GaInP layer having the tensile strain. Accordingly, it is easy to form the GaInP layer having the tensile strain. It is possible to reduce the absorption of the light at the wafer joint layer and the window layer by including the GaInAs cell 166 (1.40 eV) instead of the GaAs cell 106 (1.42 eV), even if InP layers (1.35 eV) are used as the wafer joint layer and the window layer.

According to the fifth embodiment, it is possible to obtain a compound photovoltaic cell 160 with high conversion efficiency.

Sixth Embodiment

In the sixth embodiment, a compound photovoltaic cell having a configuration different from that of the compound photovoltaic cells 100 and 120 of the first embodiment is described.

Figure 13:
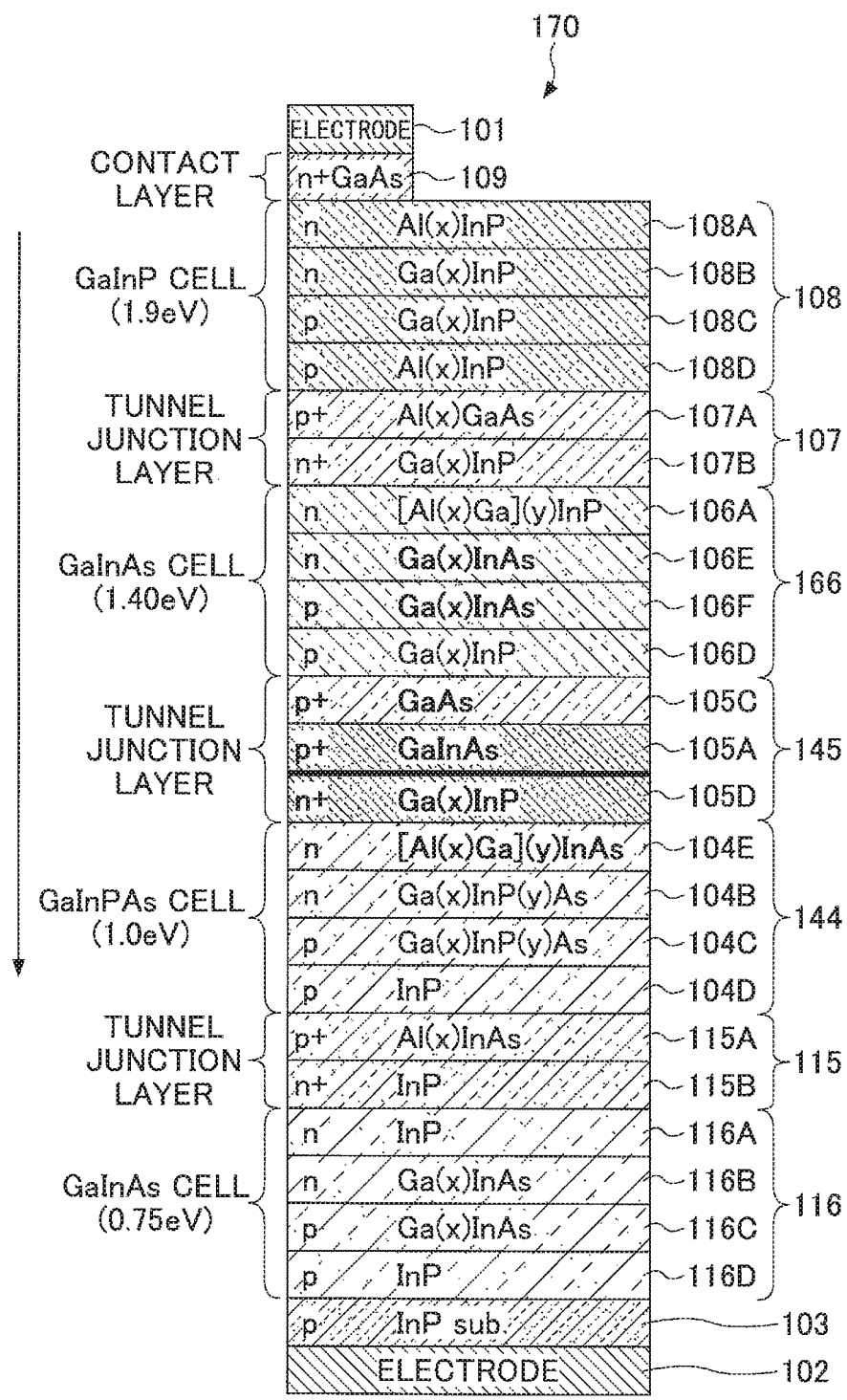
FIG. 13 illustrates a compound photovoltaic cell according to a sixth embodiment.

FIG. 13 is a diagram illustrating a compound photovoltaic cell 170 according to a sixth embodiment.

As illustrated in FIG. 13, the compound photovoltaic cell 170 includes four photoelectric conversion cells and three tunnel junction layers. As illustrated in FIG. 13, the compound photovoltaic cell 170 includes a tunnel junction layer 145 and a GaInPAs cell 144 instead of the tunnel junction layer 105 and the GaInPAs cell 104 as illustrated in FIG. 2. The tunnel junction layer 145 includes the $p^+$-type GaInAs layer 105A, the $p^+$-type GaAs layer 105C and an $n^+$-type Ga(x)InP layer 105D. The $n^+$-type Ga(x)InP layer 105D has a tensile strain with respect to InP. The $n^+$-type Ga(x)InP layer 105D is provided instead of the $n^+$-type InP layer 105B and functions as an $n^+$-type tunnel junction layer of the tunnel junction layer 145. The GaInPAs cell 144 includes a [Al(x)Ga](y)InAs layer 104E, the n-type Ga(x)InP(y)As layer 104B, the p-type Ga(x)InP(y)As layer 104C and the p-type InP layer 104D. The [Al(x)Ga](y)InAs layer 104E is provided instead of the n-type InP layer 104A and functions as a window layer of the GaInPAs cell 144. The compound photovoltaic cell 170 includes a GaInAs cell 166 instead of the GaAs cell 106. The GaInAs cell 166 includes an n-type [Al(x)Ga](y)InP layer 106A, an n-type Ga(x)InAs layer 106E, a p-type Ga(x)InAs layer 106F and a p-type Ga(x)InP layer 106D. The n-type Ga(x)InAs layer 106E and the p-type Ga(x)InAs layer 106F have compression strains. Other than the GaInAs cell 166 including the n-type Ga(x)InAs layer 106E and the p-type Ga(x)InAs layer 106F, the compound photovoltaic cell 170 has the same configuration as that of the compound photovoltaic cell 150 as illustrated in FIG. 11.

The $n^+$-type Ga(x)InP layer 105D is highly doped. With regard to the $n^+$-type Ga(x)InP layer 105D, a composition ratio of Ga is 7.0%, a tensile strain is 0.5% and a band gap is 1.40 eV.

With regard to the n-type Ga(x)InAs layer 106E and the p-type Ga(x)InAs layer 106F, composition ratios of In (Indium) are 1.5%, tensile strains with respect to InP are 0.1% and band gaps are 1.40 eV. The n-type Ga(x)InAs layer 106E and the p-type Ga(x)InAs layer 106F have the same composition ratio of In, tensile strain and band gap with each other.

The compound photovoltaic cell 170 is a four-junction photovoltaic cell including the GaInP cell 108, the GaInAs cell 166, the GaInPAs cell 144 and the GaInAs cell 116 of which the band gaps are 1.9 eV, 1.40 eV, 1.0 eV and 0.75 eV, respectively.

It is possible to further enhance the conversion efficiency of the compound photovoltaic cell 170 by including the GaInAs cell 166 (1.40 eV) instead of the GaAs cell 106 (1.42 eV), by selecting appropriate materials for the $n^+$-type tunnel junction layer and the window layer having appropriate band gaps and by including a multi-junction configuration as described above.

According to the sixth embodiment, it is possible to obtain a compound photovoltaic cell 140 with high conversion efficiency.

The compound photovoltaic cell is not limited to the specific embodiments described herein, and variations and modifications may be made without departing from the scope of the present invention.

The present application is based on and claims the benefit of priority of Japanese Priority Patent Application No. 2013-157477, filed on Jul. 30, 2013 and Japanese Priority Patent Application No. 2014-118296, filed on Jun. 9, 2014, the entire contents of which are hereby incorporated herein by reference.

The invention claimed is:

1. A production method of a compound photovoltaic cell, the method comprising:
   a process of stacking one or more first photoelectric conversion cells made of a first compound semiconductor material to be formed on a first substrate;
   a process of stacking a first junction layer made of a second compound semiconductor material to be formed on the one or more first photoelectric conversion cells;
   a process of forming one or more second photoelectric conversion cells made of a fourth compound semiconductor material to be disposed on an incident side in a light incident direction with respect to the one or more first photoelectric conversion cells on a second substrate;
   a process of forming a second junction layer made of a third compound semiconductor material on the one or more second photoelectric conversion cells;
   a process of directly joining the first junction layer and the second junction layer; and
   a process of removing the second substrate,
   wherein the band gaps of the one or more first photoelectric conversion cells and the one or more second photoelectric conversion cells become smaller from the incident side to a back side in the light incident direction,
   wherein the one or more first photoelectric conversion cells include an InP lattice matching material,
   wherein the one or more second photoelectric conversion cells include a GaAs lattice matching material,
   wherein the first substrate is an InP substrate,
   wherein the second junction layer is a $p^+$-type (Al)GaInAs layer,
   wherein the first junction layer and the second junction layer are directly joined to form a tunnel junction, and wherein the first junction layer is an n⁺-type GaInP layer having (i) a tensile strain with respect to the InP lattice matching material, and (ii) a lattice constant greater than that of the second junction layer.

2. The production method of the compound photovoltaic cell as claimed in claim 1, wherein a band gap of the n⁺-type GaInP layer is greater than or equal to a band gap of the second photoelectric conversion cell located on a backmost side in the light incident direction among the one or more second photoelectric conversion cells.

3. The production method of the compound photovoltaic cell as claimed in claim 1, wherein the lattice constant of the n⁺-type GaInP layer is closer to a lattice constant of InP than to a lattice constant of GaAs.

4. The production method of the compound photovoltaic cell as claimed in claim 1, the method further comprising:
a process of stacking a p⁺-type (Al)GaAs layer before forming the second junction layer made of the third compound semiconductor material on the one or more second photoelectric conversion cells,
wherein the p⁺-type (Al)GaAs layer directly contacts the p⁺-type (Al)GaInAs layer.

5. The production method of the compound photovoltaic cell as claimed in claim 4, wherein the p⁺-type (Al)GaAs layer has a greater band gap than GaAs.

6. The production method of the compound photovoltaic cell as claimed in claim 5, wherein the lattice constant of the n⁺-type GaInP layer is closer to a lattice constant of InP than to a lattice constant of GaAs.

7. The production method of the compound photovoltaic cell as claimed in claim 1, the method further comprising:
a process of stacking a window layer before stacking the first junction layer on the one or more first photoelectric conversion cells,
wherein a band gap of the window layer is greater than or equal to a band gap of the second photoelectric conversion cell located on a backmost side among the one or more second photoelectric conversion cells.

8. The production method of the compound photovoltaic cell as claimed in claim 7, wherein the window layer includes any one material of GaInP, GaPSb, GaInPSb AlInAs, AlGaInAs, AlAsSb, AlGaAsSb, AlPSb, AlGaPSb, AlPSb and AlInPSb.

9. The production method of the compound photovoltaic cell as claimed in claim 1, wherein the second photoelectric conversion cell located on backmost side among the one or more second photoelectric conversion cells includes a GaInAs material having a compression strain with respect to GaAs.

10. The production method of the compound photovoltaic cell as claimed in claim 1, wherein a total number of the first and second photoelectric conversion cells is at least three, and
wherein the first and second photoelectric conversion cells are optically connected in series.

* * * * *